(12) United States Patent
Cham et al.

(10) Patent No.: US 6,526,076 B2
(45) Date of Patent: Feb. 25, 2003

(54) INTEGRATED PARALLEL CHANNEL OPTICAL MONITORING FOR PARALLEL OPTICS TRANSMITTER

(75) Inventors: Kit M. Cham, Cupertio, CA (US); Myunghee Lee, San Jose, CA (US); James J. Dudley, Sunnyvale, CA (US); Stefano G. Therisod, San Jose, CA (US); Craig T. Cummings, Cupertino, CA (US); Yu-Chun Chang, San Jose, CA (US); Ye Christine Chen, San Jose, CA (US); Christopher L. Coleman, Santa Clara, CA (US); Ronald Kaneshiro, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 173 days.

(21) Appl. No.: 09/738,417

(22) Filed: Dec. 15, 2000

(65) Prior Publication Data

US 2002/0075911 A1 Jun. 20, 2002

(51) Int. Cl.[7] .................................................. H01S 3/13
(52) U.S. Cl. ................................ 372/29.011; 372/29.01; 372/38.01; 369/112.04; 369/112.12
(58) Field of Search ..................... 372/29.011, 29.01, 372/38.01, 102, 96, 46; 369/112.12, 112.04; 257/80, 82

(56) References Cited

U.S. PATENT DOCUMENTS

| | | | | |
|---|---|---|---|---|
| 5,710,753 A | * | 1/1998 | Brazas | 369/112.12 |
| 5,809,050 A | | 9/1998 | Baldwin et al. | 372/43 |
| 5,930,276 A | * | 7/1999 | Dou et al. | 372/29.011 |
| 6,081,539 A | * | 6/2000 | Mattori et al. | 372/102 |
| 6,097,860 A | * | 8/2000 | Laor | 385/17 |

\* cited by examiner

*Primary Examiner*—Albert W. Paladini

(57) ABSTRACT

For each channel in a parallel channel optical array, a diffractive optical arrangement (DOA) includes an input region that is configured to pass a first portion of an input beam to an output region for data transmissions and to diffract and direct a second portion to a detection region for monitoring. The input region includes the diffractive features of a computer generated hologram (CGH) or a grating for diffracting. Alternatively, the input region is coupled to the CGH or grating. Moreover, the DOA includes at least one reflective region for redirecting the second portion. In one embodiment, the DOA includes a separate active surface for each channel of the array. Alternatively, the DOA has a singular active surface that is positioned to interact with all the channels. Optical power output from the second portion is monitored to generate feedback signals for adjusting the input current to each laser. Additionally, optical power output from sensed temperature is monitored to generate feedback signals.

21 Claims, 17 Drawing Sheets

| DIFFRACTION ORDER \ TARGET TRANSMISSION | 50% | 60% | 75% |
|---|---|---|---|
| −9 | 15.0% | 12.2% | 6.4% |
| Σ(−8,−1) | 2.2% (max 0.5%) | 1.2% (max 0.3%) | 2.8% (max 0.6%) |
| 0 | 52.6% | 59.4% | 76.3% |
| Σ(+1,+8) | 2.5% (max 0.5%) | 2.0% (max 0.7%) | 0.9% (max 0.4%) |
| +9 | 21.3% | 16.7% | 8.6% |

FIG. 10

INTEGRATED PARALLEL CHANNEL OPTICAL MONITORING FOR PARALLEL OPTICS TRANSMITTER

TECHNICAL FIELD

The invention relates generally to optical-monitoring systems and more particularly to an optical arrangement for directing optical beams for monitoring and feedback.

BACKGROUND ART

Increasingly, data communications involve transmissions by optical sources that can deliver tremendous volumes of digitized information as pulses of light. This is especially true for many communication companies that utilize laser diodes and optical fibers as their primary means for the transmission of voice, television and data signals for ground-based communications networks.

To achieve high bandwidth, laser diodes such as Fabry-Perot lasers and Vertical Cavity Surface Emitting Lasers (VCSELs) are commonly utilized as optical sources. These types of laser diodes are preferred due to their minute dimensions. For example, the typical VCSEL is measured in the order of micrometers. Consequently, an array of laser diodes can be integrated into a system to achieve high bandwidth transmissions.

In many applications, the optimum output of a laser diode is dependent on the light intensity or the optical power output that is generated by the optical source. Many factors can affect the optical power output. For one, a temperature variation in the environment under which the diode is operating can affect the optical power output, even assuming that all the other variables remain constant. At a certain input current beyond the threshold level, the laser diode changes from the light emitting diode (LED) mode of operation into the laser mode. Under the LED mode, incoherent light is emitted that diffuses rapidly. This mode is inadequate for data transmissions over long distances due to a generally inherent significant loss of optical power. Under the laser mode, however, the light narrows into a coherent beam as the input current is increased. This mode is adequate for data transmissions over long distances. While the diodes of a particular class of diodes will have threshold levels in a relatively narrow range of input currents, the threshold level of a particular diode in the class can vary significantly with changes in the surrounding temperature. For example, the threshold level of some diodes can vary by as much as fifty percent as temperature changes cause the diodes to fluctuate between their normal threshold level and their deviated maximum level. Temperature variation can drastically affect the level of optical power output by a laser diode.

A second factor that can affect the optical power output is the age of the laser diode. As with other devices, the performance of the laser diode will degrade as a function of time. For one, the threshold level at which the laser diode switches from the LED mode to the laser mode can vary significantly due to the degradation of the diode from extended uses. Consequently, the integrity of data transmissions will be jeopardized.

As the demand for VCSELs increases, it is expected that no single manufacturer will have the capacity to provide all of the required laser diodes. With more manufacturers entering into the supply channel, VCSELs that fall within the same class having the same specifications will manifest dissimilar optical and electrical characteristics over prolonged uses. This is true even for VCSELs from the same batch produced by the same manufacturer. The problem is twofold. If the intensity of the beam is too high, the product may be harmful to the eyes. Eye safety is a factor that is considered in the design and testing of VCSELs. On the other hand, if the intensity is too low, the integrity of the transmitted data may be compromised. Thus, there is only a narrow band of optical power output level in which a VCSEL can operate to achieve satisfactory safety and performance.

Based on the various factors that can affect the performance of a VCSEL, the optical power output is regularly monitored and the input current to the emitting source is adjusted in order to ensure an optimum output for both operation and safety. Typically, a VCSEL is monitored by using a photo-detector, so that the optical power of the transmitted beam from the VCSEL is converted into electrical signal. The optical power output received by the photo-detector is used as a feedback signal that is coupled to a feedback controlling system, for adjusting and biasing the input current to the VCSEL.

In the case of a parallel channel optical array, an array of VCSELs having multiple channels is used for data communications. For a 1×n VCSEL array, there are n VCSELs with n corresponding channels for data transmissions. The n VCSELs are typically fabricated on a semiconductor substrate, such as a type III-V semiconductor wafer.

To ensure acceptable operational performance for the parallel channel optical array, the optical power outputs of the VCSELs are monitored and the input currents are responsively adjusted. One known arrangement for monitoring the optical power output of the VCSEL array is to monitor an end VCSEL of the array. As an example, in a 1×n VCSEL array, only the VCSEL that is located at the farthest end is monitored. Thus, if the 1×n array is numbered in sequence from the 1st VCSEL to the nth VCSEL, either the 1st VCSEL or the nth VCSEL is monitored. The VCSEL that is used for monitoring will not be used for data transmissions. This method presumes that the VCSEL that is monitored manifests optical and electrical characteristics that are representative of the other n-1 VCSELs in the array. However, since only one VCSEL is monitored, this arrangement does not provide specific information on any particular VCSEL that is not monitored.

Another arrangement for providing monitoring of the optical power output of the VCSEL array is to monitor both ends of the array. In the same exemplary 1×n array, the 1st VCSEL and the nth VCSEL are both monitored. While a more accurate representation of the operational characteristics of the other VCSELs is provided, this arrangement suffers from two problems. First, no specific information is acquired on the other n-2 VCSELs. Second, two fewer VCSELs in the array are used for data transmissions.

Consequently, what is needed is an arrangement that allows every laser diode in the parallel channel optical array to be monitored in order to ensure that every diode is operating at its target level.

SUMMARY OF THE INVENTION

The invention utilizes a diffractive optical arrangement (DOA) that is configured to diffract a portion of an input beam of every vertical cavity surface emitting laser (VCSEL) in a parallel channel optical array, so that all of the VCSELs can be monitored simultaneously. For every channel in the array, there is a detector for monitoring the optical power output of the associated VCSEL and a feedback system for adjusting the input current. The DOA comprises a collimating beam input region on one side, a beam output region on the opposite side, and a detection output region. The DOA is configured to pass a first portion of a beam from the collimating beam input region to the beam output region for data transmissions and to diffract a second portion from the collimating beam input region to the detection output region for monitoring. The collimating beam input region includes a diffractive feature, which may be that of a computer generated hologram (CGH) or may be a grating.

In one embodiment, the input beam that is emitted by a specific VCSEL impinges the DOA at the collimating beam input region having the diffractive feature. The second portion that is diffracted propagates through the DOA to a detection output region and onto a detector for monitoring the optical power output. In this embodiment, the VCSEL and detector are on opposite sides of the DOA.

In another embodiment, the second portion that is diffracted by the diffractive feature of the beam input region is reflected by a first reflective region at the opposite sides of the DOA. The reflected second portion is directed to the detection output region, which is on the same side of the DOA as the VCSEL.

In yet another embodiment, the DOA includes a sequence of optical regions which cooperate to reflect and direct the diffracted portion of the input beam to the detection region. The input beam that is emitted by any one of the VCSELs impinges the DOA at the associated collimating beam input region that includes the diffractive feature. The second portion that is diffracted propagates through the DOA to a first reflective region, where it is reflected and directed to a second reflective region. The second portion is reflected and directed by the second reflective region through the DOA to a third reflective region. The reflected portion from the third reflective region propagates through the DOA to the detection output region. The detection output region directs the second portion to a detector for beam monitoring and feedback adjustment.

In accordance with the invention, the detector can be made of silicon, gallium arsenide, indium gallium arsenide, or of a material that is sensitive to the wavelength of the input beam generated by the VCSEL. Moreover, the reflective regions may be mirrors, reflective coatings, or metallic coated surfaces (e.g., reflecting diffractive optical elements) for directing the second portion to a next region of interest. The next region of interest may be a subsequent reflective region or the detection output region.

In accordance with the preferred embodiment, there is an array of DOAs, with each DOA corresponding to a specific channel in the parallel channel optical array. In an alternative embodiment, there is a single DOA that corresponds to all the channels in the parallel array. That is, the single DOA is configured to diffract the second portions of all the input beams that are emitted from the VCSELs in the array.

While not critical, the collimating beam input region of the DOA may have a spiral-phase configuration. This design eliminates the feedback of the optical power back to the emitting source of the VCSEL. The detected optical power output will have a ring-shaped pattern.

The diffractive feature of the collimating beam input region may be that of a computer generated hologram (CGH) or a grating. The CGH may be one-dimensional or two-dimensional. In one embodiment, the one-dimensional CGH integration comprises eight discrete depths per period that is repeated along one axis. Due to the diffractive principles of the CGH, the detected optical power output is a series of similarly shaped patterns, e.g., ring-shaped patterns when the spiral phase is included. The ring-shaped pattern that is not deviated by the CGH is the 0th diffraction order, corresponding to the first portion for data transmissions. The ring-shaped pattern with the intensity at a large angle deviation (e.g., the 9th diffraction order) corresponds to the second portion for monitoring and feedback. Optical power outputs in the other diffraction orders that are not selected for data transmissions (i.e., 0th diffraction order) or for monitoring (i.e., 9th diffraction order) are considered as noise and cross talk signals and are kept to a minimum.

In another embodiment, the diffractive feature of the collimating beam input region is that of a two-dimensional CGH. The CGH integration comprises eight discrete depths per period that are repeated along two axes. The detected output shows a series of similarly shaped patterns similar to the one-dimensional CGH, except that the optical power output of the two-dimensional CGH can be, for example, two intersecting series of similarly shaped patterns. Alternatively, the diffractive feature of the collimating beam input region is that of a volume hologram. In yet another embodiment, the diffractive feature of that of a grating is used to diffract the second portion of the input beam for monitoring.

While the preferred embodiment is described as having the diffractive feature being integrated to the collimating beam input region for diffracting the second portion, the diffractive feature can be fabricated and configured into a separate element. In this alternative two-piece arrangement, the collimating beam input region is able to diffract the second portion of the input beam while being coupled to a separate diffractive element.

In every channel, the input current for the associated VCSEL in the array is adjusted by a closed-loop feedback system. A first source of a feedback signal is the optical power that is received by the detector. Additionally, a second source of the feedback signal can be the optimum optical power at the current temperature. The value of the optimum optical power is provided by a memory device having operating parameters corresponding to the surrounding temperatures that are measured by a temperature sensor. The feedback system utilizes both feedback signals for adjusting the input current to every VCSEL in the array.

One of the advantages of the invention is that by providing monitoring and feedback for each VCSEL of the parallel channel optical array the system ensures acceptable performance for every channel, guarding against unacceptable losses that might result from temperature variations and aging effects. Moreover, monitoring a channel does not limit that channel to being used to provide feedback signals. Rather, the monitored channel can provide signals for data transmissions, as well as for monitoring.

BRIEF DESCRIPTION OF THE DRAWINGS

FIG. 10 is simulated data showing the optical power outputs of the one-dimensional CGH of FIG. 9 at three target transmissions.

DETAILED DESCRIPTION

Figure 1:
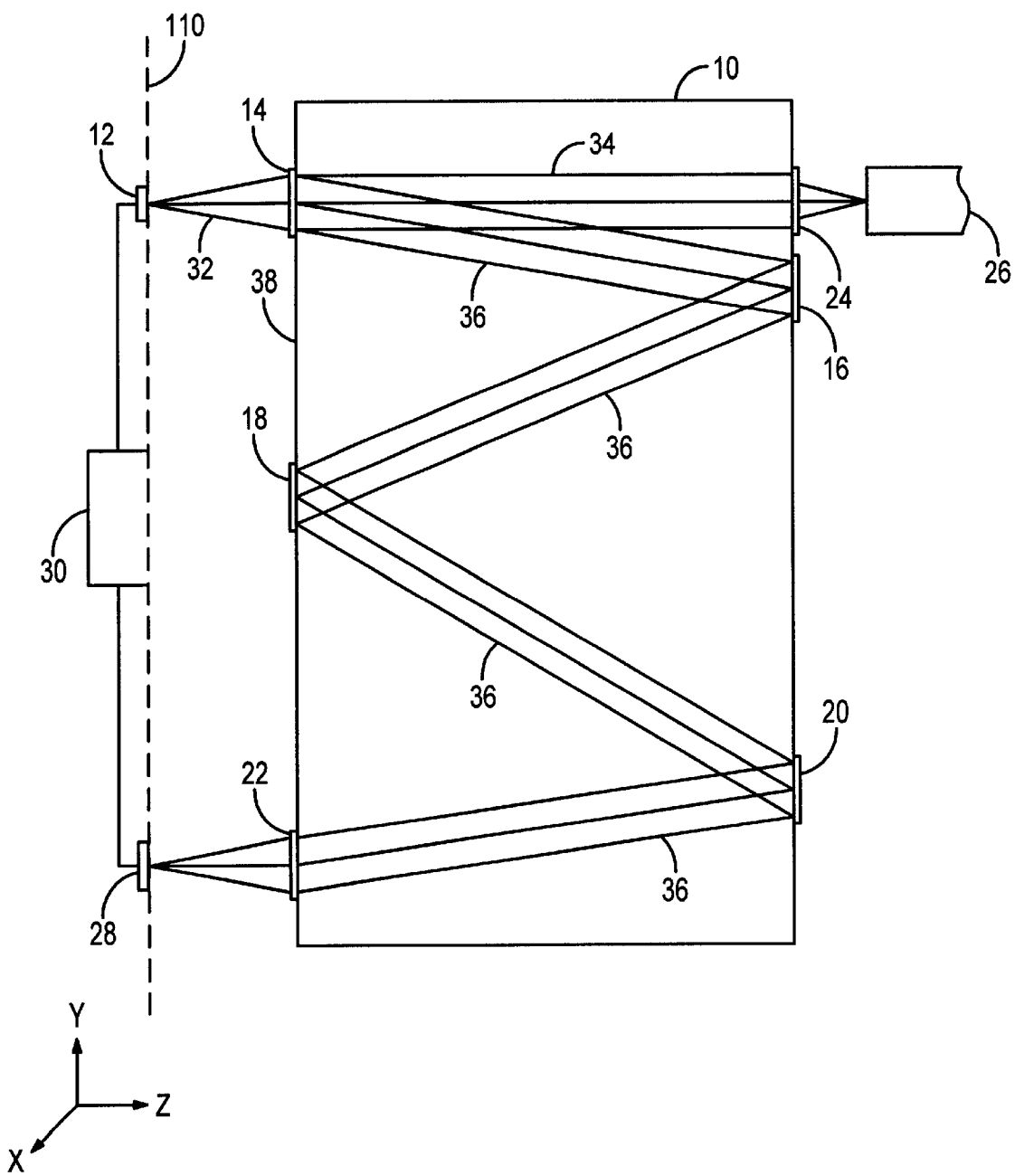
FIG. 1 is a cross-sectional view of a diffractive optical arrangement (DOA) in accordance with the invention, utilizing an array of reflective regions for reflecting and directing a second portion of an input beam to a detection output region.
Figure 12:
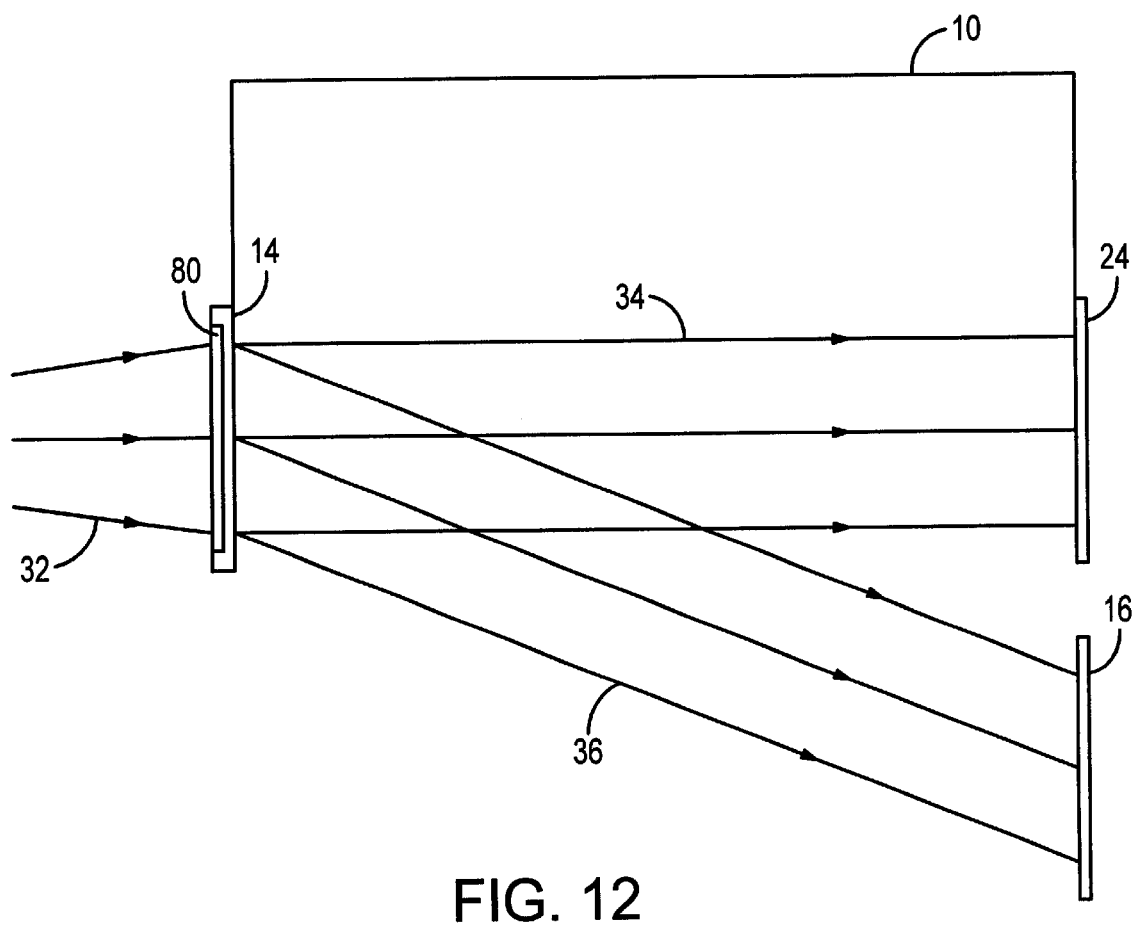
FIG. 12 is a cross-sectional view of the DOA of FIG. 1 showing the collimating beam input region as having diffractive properties of a grating.

FIG. 1 is an illustration of one preferred architecture of a diffractive optical arrangement (DOA) 10. For every channel of a parallel channel optical array, the DOA 10 includes a number of optical regions that are configured to pass a first portion 34 of an input beam 32 to a beam output region 24 for data transmissions. Moreover, the DOA is configured to diffract and direct a second portion 36 of the input beam 32 to a detection output region 22. The optical regions include: (a) a collimating beam input region 14, (b) the beam output region 24, (c) a first reflective region 16, (d) a second reflective region 18, (e) a third reflective region 20, and (f) a detection output region 22. The collimating beam input region 14 includes a diffractive feature for passing the first portion 34 and diffracting the second portion 36. In one embodiment, the diffractive feature is that of a computer generated hologram (CGH) 64 (FIG. 7) that is configured to diffract the second portion 36. In an alternative embodiment, the diffractive feature is that of a grating 80 (FIG. 12).

The input beam 32 that is emitted from a VCSEL 12 impinges the DOA 10 at the collimating beam input region 14. The collimating beam input region 14 is typically made of glass, plastic, or a material that allows the propagation of light. To minimize reflection of the input beam 32 back to the emitting region of the VCSEL 12, the surface of the collimating beam input region 14 may be fabricated to have a distinctive design that minimizes performance-affecting reflection by diverting any reflected portion away from the emitting region.

The diffractive element is configured to pass the first portion 34 of the input beam 32 to the beam output region 24 that is aligned and located on the opposite side of the beam input region 14. The beam output region 24 is coupled to an optical fiber 26 that is utilized for data transmissions. To minimize reflection of the first portion 34 back to the emitting region of the VCSEL 12, the surface of the beam output region 24 may be layered with an anti-reflective coating (not shown). Moreover, the diffractive element is configured to diffract the second portion 36 of the input beam 32 to a first reflective region 16 that is located on the opposite side of the beam input region 14 of the DOA 10. The second portion 36 that is reflected by the first reflective region 16 propagates through the DOA 10 to a second reflective region 18 that is located on the opposite side of the DOA and on the same side as the beam input region 14. The second portion 36 that is reflected by the second reflective region 18 propagates through the DOA 10 to a third reflective region 20 that is located on the opposite side of the DOA and on the same side as the first reflective region 16. The second portion 36 that is reflected by the third reflective region 20 propagates through the DOA 10 to the detection output region 22 that is located on the same side of the DOA as the second reflective region 18. The detection output region 22 concentrates the second portion 36 to a detector 28 that is adapted for monitoring and providing feedback signals.

In one embodiment, the reflective regions 16, 18 and 20 are mirrors placed in the propagating path of the second portion 36 to reflect the second portion 36 to the next region of interest. The next region of interest may be the reflective region 18 or 20 or the detection output region 22. The mirrors are attached to the surface of the DOA 10. In another embodiment, the reflective regions 16,18 and 20 are reflective coatings that reflect the second portion 36 to the next region of interest. In yet another embodiment, the reflective regions 16, 18 and 20 are metallic coated surfaces (e.g., reflecting diffractive optical elements), which can be used to control the angle of reflection and beam profile. Metallic coated surfaces are utilized to minimize material and manufacturing costs.

While the invention is described as comprising three reflective regions 16, 18 and 20 for reflecting and directing the second portion 36 to the next region of interest, there can be a fewer number of reflective regions for reflecting the second portion 36. Moreover, the invention may include no reflective region. In this embodiment, the second portion 36 that is diffracted propagates through the DOA 10 to the detection output region 22 that is on the opposite side of the DOA 10. Alternatively, there can be a greater number of reflective regions for reflecting the second portion 36 to the next region of interest.

For every channel of the parallel channel optical array, a dedicated detector 28 is coupled to a feedback system 30 for adjusting the input current driving the channel's VCSEL 12. The detector 28 is typically made of layers of materials that are selected to provide sensitivity to the wavelength of the input beam 32 that is generated by the VCSEL 12. Along with the detector 28, the VCSEL 12 and feedback system 30 are positioned within a medium 110. The medium 110 is parallel to a surface 38 of the DOA 10 having the collimating beam input region 14, second reflective region 18, and detection output region 22. The relative placement of the second reflective region 18 and the detection output region 22 is not critical to the invention.

Figure 2:
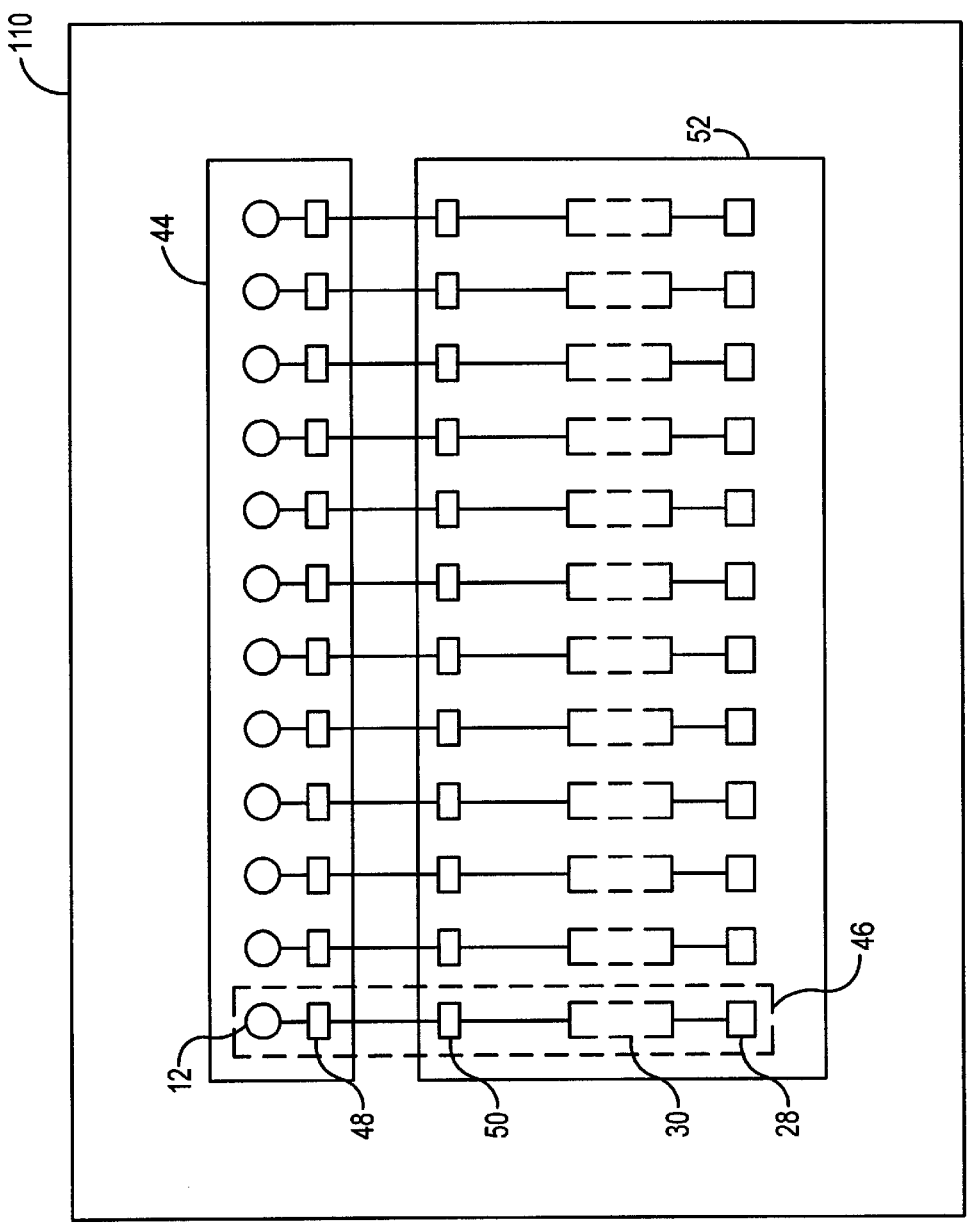
FIG. 2 is a top-sectional view of the medium of FIG. 1 showing a parallel channel optical array and a substrate.

FIG. 2 shows the preferred embodiment of the medium 110 of FIG. 1, as used in a 1×12 parallel channel optical array 44 that is fabricated on a first substrate and an integrated circuit 52 that is fabricated on a second substrate. Since the optical array 44 and the integrated circuit 52 are associated with significantly different properties, they are fabricated on different substrates. Alternatively, the optical array 44 can be mounted over the integrated circuit 52 using packaging technology, such as solder bumps. The placement of the optical array 44 with respect to the integrated circuit 52 is not critical to the invention.

The 1×12 parallel channel optical array 44 includes twelve independent channels, with each channel having its own VCSEL 12, detector 28, feedback system 30, first bonding pad 50, and second bonding pad 48. As an example, a first channel 46 of the array 44 and integrated circuit 52 includes the first VCSEL 12 for emitting an input beam 32 to the collimating beam input region 14 of the DOA 10 of FIG. 1. The surface 38 of the DOA 10 is positioned parallel to the medium 110. The input beam 32 is diffracted by the diffractive element that is coupled to the collimating beam input region 14. The second portion 36 is subsequently directed to the detection output region 22 and onto the detector 28. The feedback signal that is generated by the detector 28 is responsive to the intensity of the second portion and is received by the feedback system 30. The feedback system 30 is shown as a dashed block since it is formed within the integrated circuit 52. The outgoing current from the feedback system 30 is conducted to the first bonding pad 50 that is coupled to the second bonding pad 48. The outgoing current received by the second bonding pad 48 is used to drive the VCSEL 12 of the first channel 46.

Figure 3A:
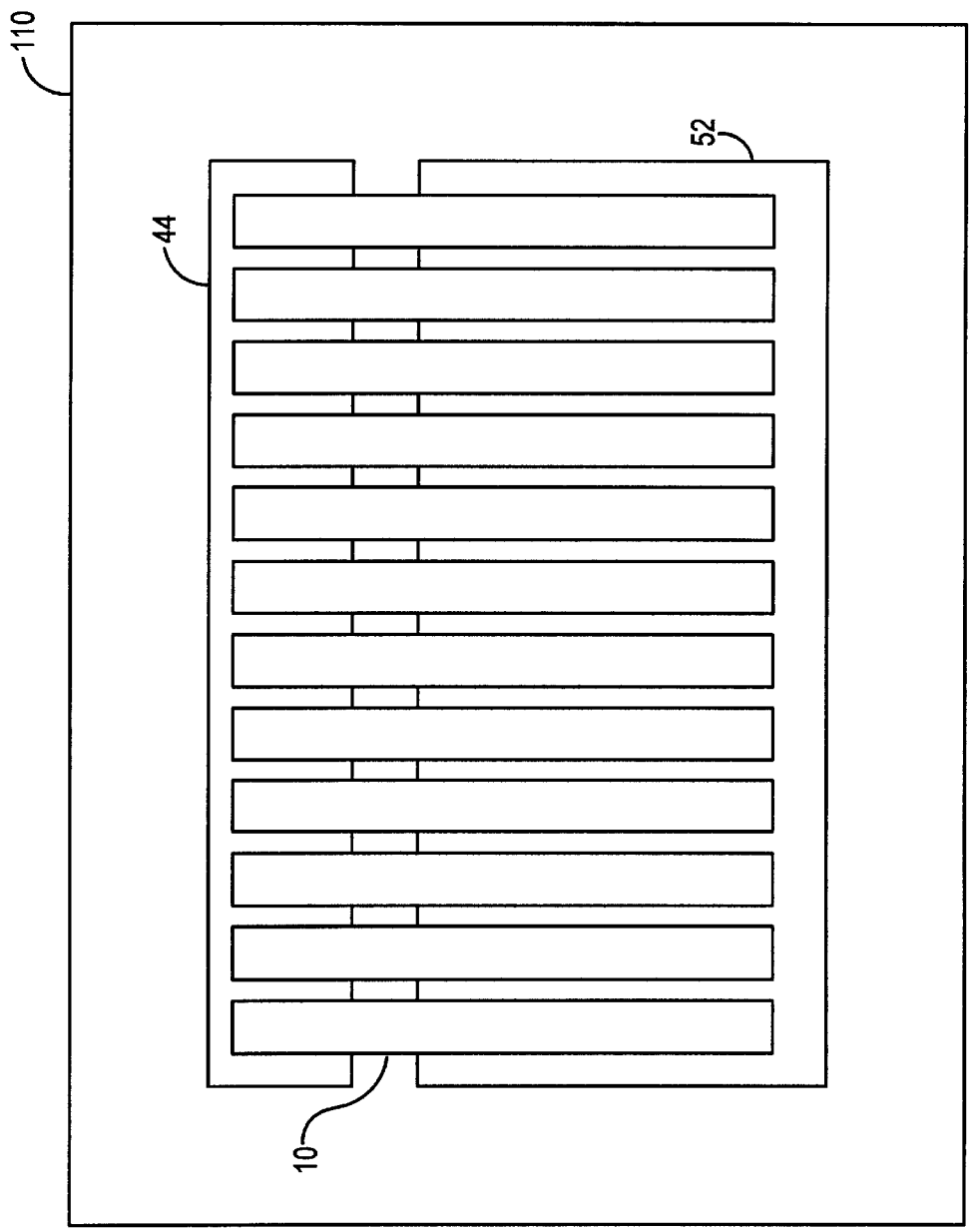
FIG. 3A is a top-sectional view of the medium of FIG. 2 with an array of DOAs and with each DOA corresponding to an independent channel of the array.
Figure 3B:
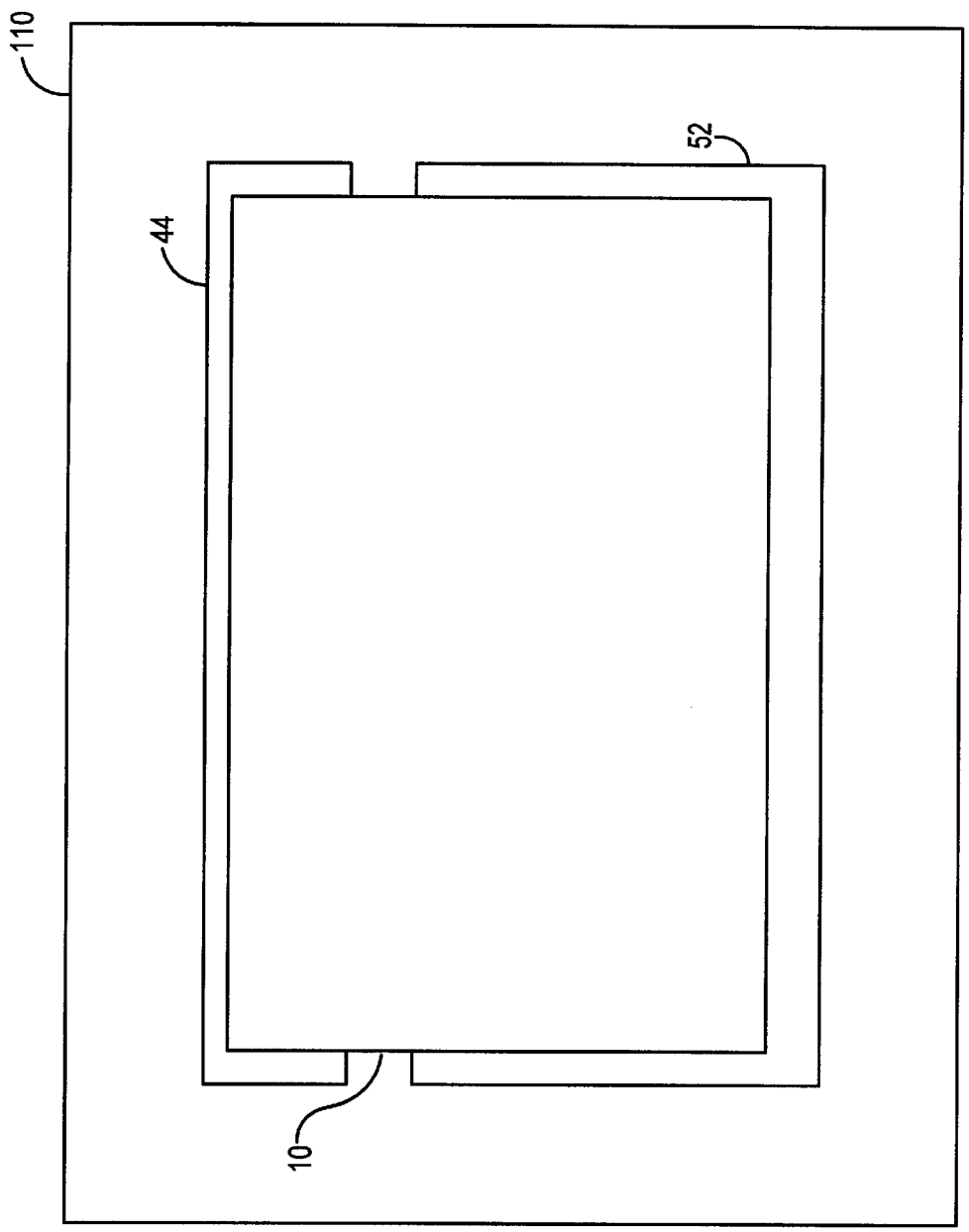
FIG. 3B is a top-sectional view of the medium of FIG. 2 with a single DOA corresponding to all the channels of the array.

In accordance with the preferred embodiment, FIG. 3A shows twelve separate and independent DOAs 10, with each DOA 10 being configured to diffract and direct the second portion 36 to the detector 28 for each respective channel of the parallel channel optical array 44. In accordance with an alternative embodiment, FIG. 3B shows a single DOA 10 being configured to diffract and direct the second portions 36 to the detectors 28 for all the channels of the array 44. Alignment pins (not shown) are utilized to secure and precisely align the medium 110 to the DOA(s) 10.

While the parallel channel optical array 44 is described as having twelve independent channels, an array having a greater number or a fewer number of channels can be implemented without diverting from the scope and spirit of the invention. Further, an n×n array, such as a 4×4 array, can be implemented in accordance with the invention. Consequently, a greater number of DOAs can likewise be implemented, with each DOA corresponding to a respective channel of the array. Moreover, laser diodes such as Fabry-Perot lasers, gas-based lasers, and the like can be utilized in the parallel channel array in place of the VCSELs, as long as the emitted input beam is sufficient for data transmissions and monitoring.

Figure 4:
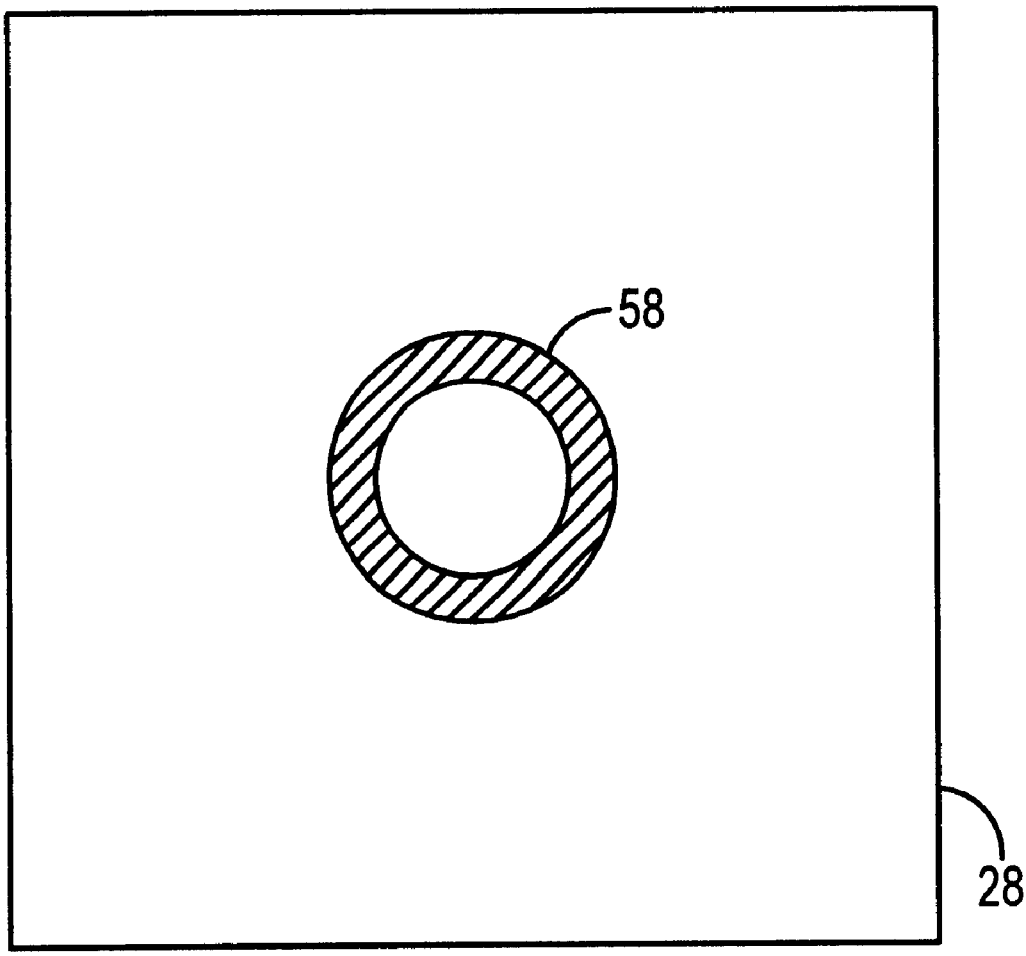
FIG. 4 is a cross-sectional image of the diffracted portion that is within the allowable tolerance of the detector for parallel shifts between the DOA and the medium of FIG. 1.

With reference to FIG. 4, the detector 28 includes a surface area of 150 µm×150 µm for receiving and detecting a cross-sectional image 58 of the second portion 36 that is diffracted by the detection output region 22. The cross-sectional image 58 is approximately 50 µm in diameter. Given these specifications, the total tolerance (representing the acceptable range in movement along the x and y axes between the medium 110 and the surface 38 of the DOA 10) of ±15 µm is well within the 150 µm×150 µm receiving surface area of the detector 28.

Figure 5C:
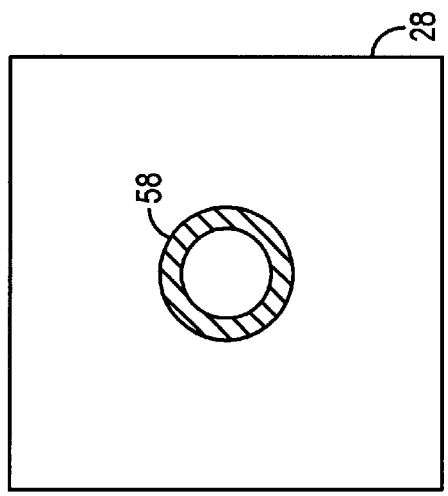
FIGS. 5A, 5B and 5C are cross-sectional images of the diffracted portion that is within the allowable tolerance of the detector for perpendicular shifts between th DOA and the medium of FIG. 1.
Figure 5B:
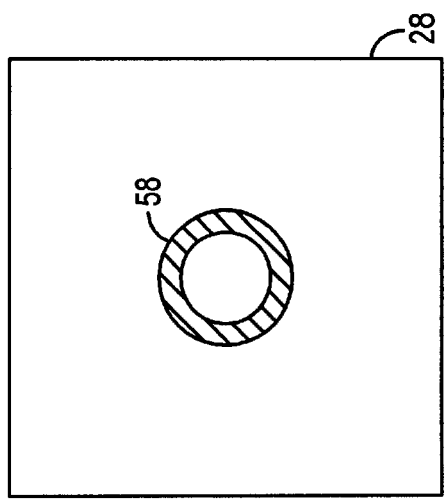
Figure 5A:
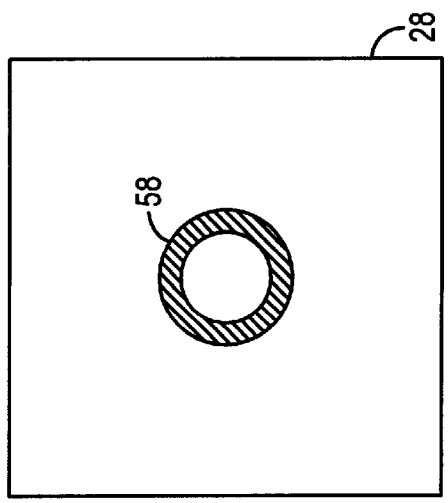

For shifts along the z axis, the total tolerance (representing the acceptable range in perpendicular movement between the medium 110 and the surface 38) of ±40 µm is well within the surface area of the detector 28 having a 150 µm×150 µm receiving surface area. FIG. 5A shows the cross-sectional image 58 of the second portion 36 on the detector 28 with no shift along the z axis. That is, the separation distance along the z axis between the medium 110 and the surface 38 is at a target distance that is ideal for operation. With reference to FIG. 5B, the cross-sectional image 58 is well within the detectable surface area of the detector 28 with a shift of −40 µm along the z axis between the medium 110 and the surface 38. Similarly, FIG. 5C shows that the cross-sectional image 58 is well within the detectable surface area of the detector 28 with a shift of +40 µm along the z axis between the medium 110 and the surface 38.

Figure 6A:
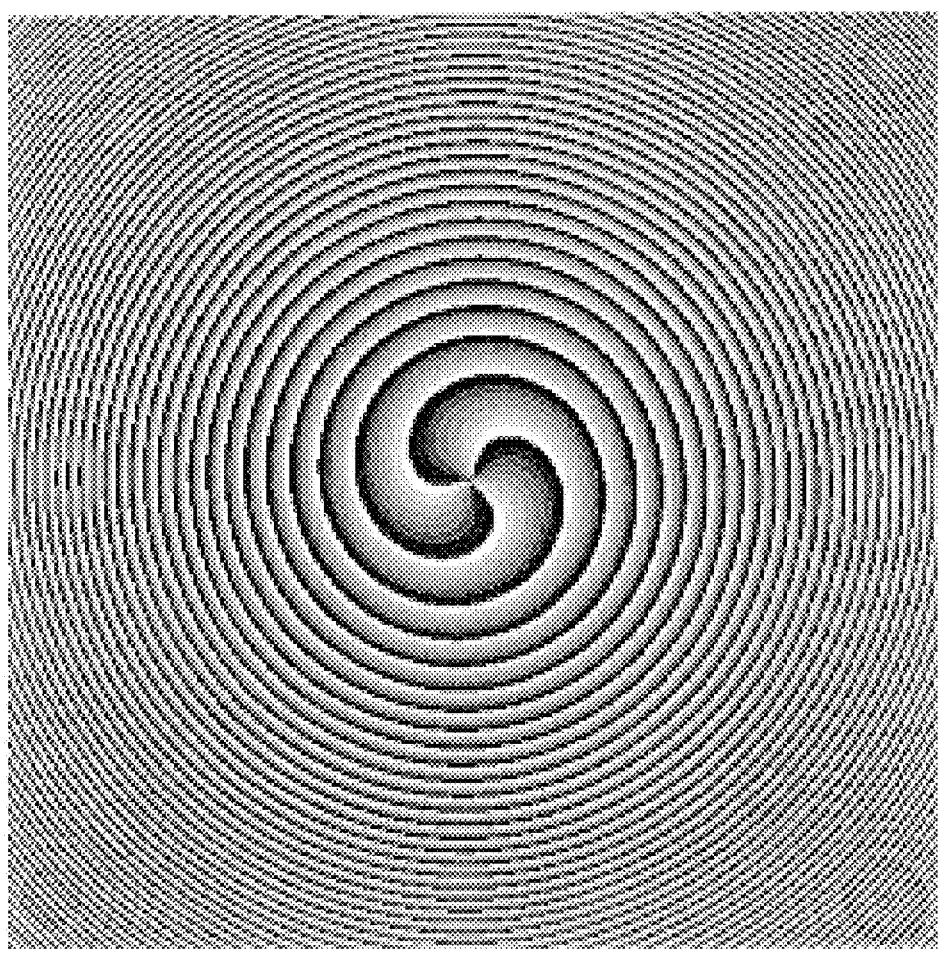
FIG. 6A is a collimating beam input region of FIG. 1 having a spiral configuration.
Figure 6B:
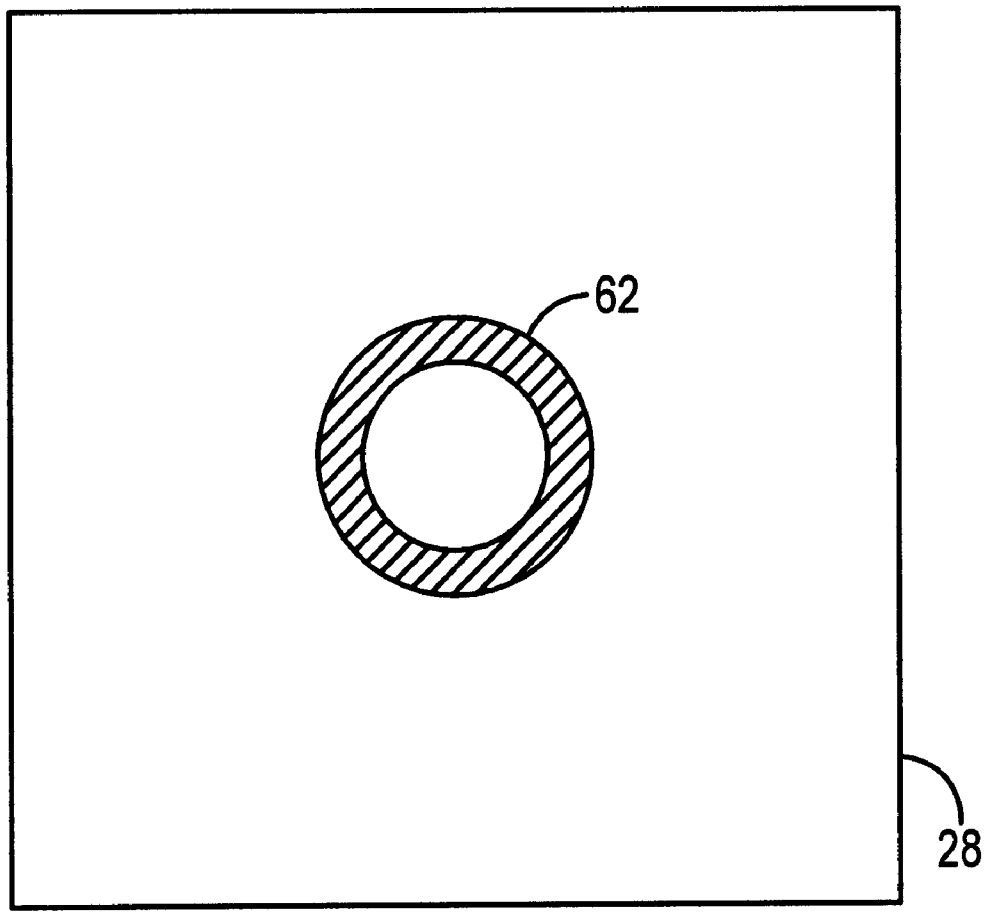
FIG. 6B is a detected ring-shaped pattern for the collimating beam input region FIG. 6A.

In the preferred embodiment, the beam input region 14 has a spiral-phase configuration 60 shown in FIG. 6A. The spiral-phase configuration 60 is designed to minimize any reflection back to the emitting surface of the VCSEL 12 by diverting any reflected portion away from the source. The optical power output that is reflected back to the VCSEL 12 is a ring-shaped pattern, where the optical power concentration is diverted away from the emitting surface of the VCSEL 12. FIG. 6B shows a ring-shaped pattern 62 that is received by the detector 28 for the beam input region 14 having the spiral-phase configuration 60.

Figure 7:
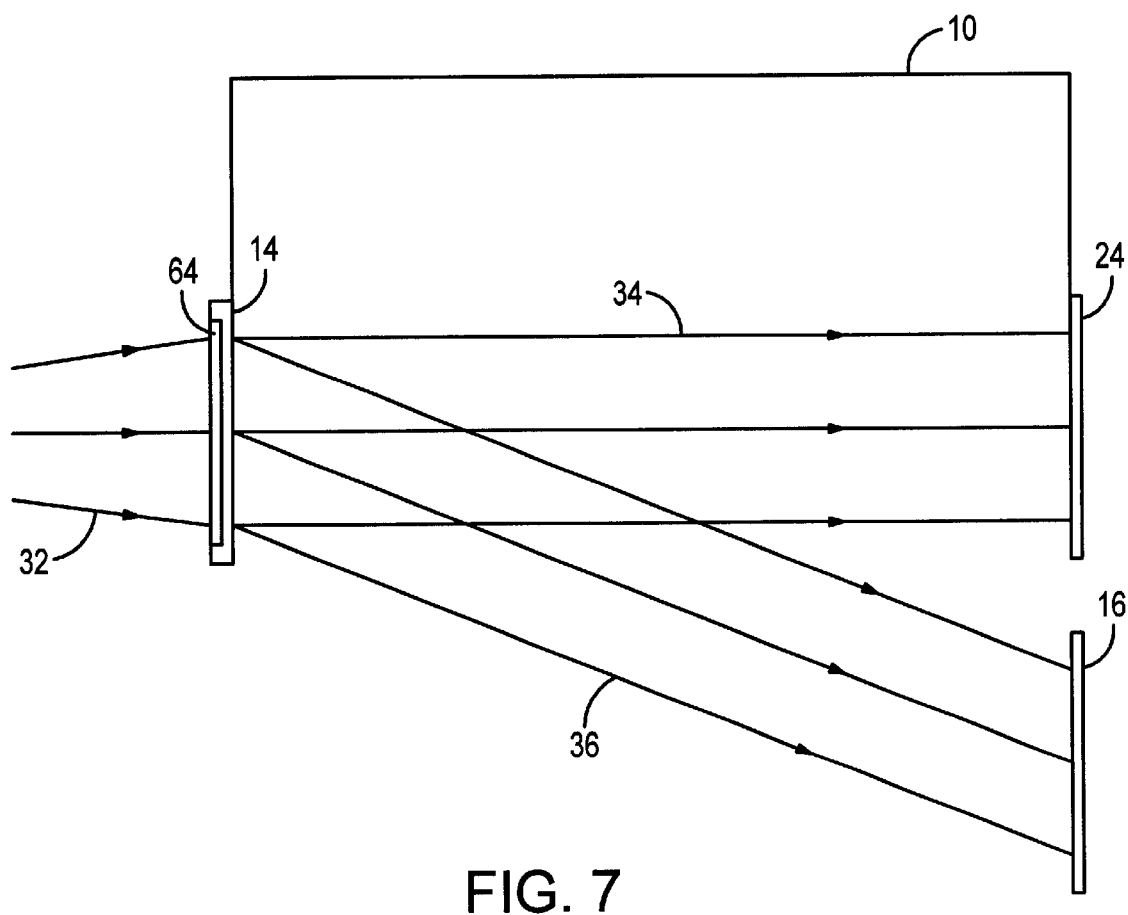
FIG. 7 is a cross-sectional view of the DOA of FIG. 1 showing the collimating beam input region as having diffractive properties of a computer generated hologram (CGH).

In accordance with one embodiment, FIG. 7 shows the collimating beam input region 14 of FIG. 1 as having a diffractive feature which may be that of a computer generated hologram (CGH) 64. In the preferred embodiment, while the diffractive feature of the CGH 64 is integrated within the beam input region 14, the CGH 64 will be described as a separate element for the sake of clarity. The CGH 64 is configured to pass the first portion 34 of the input beam 32 through the DOA 10 to the beam output region 24 that is aligned and located on the opposite side of the CGH 64. Moreover, the CGH 64 is configured to diffract and direct the second portion 36 of the input beam 32 through the DOA 10 for monitoring and feedback. While the diffracted portion is described as being the second portion 36 of the input beam 32, the CGH 64 can be designed to diffract a portion that is greater than fifty percent of the intensity of the input beam 32.

The CGH 64 has a numerically optimized design to provide the desired diffraction-inducing configuration of surface relief. It is a substantially transparent member that can be formed on glass, plastic, metal, semiconductor, dielectric, polymer, and the like, as long as the refractive index differs from the surrounding medium which, in this case, is air.

Figure 8A:
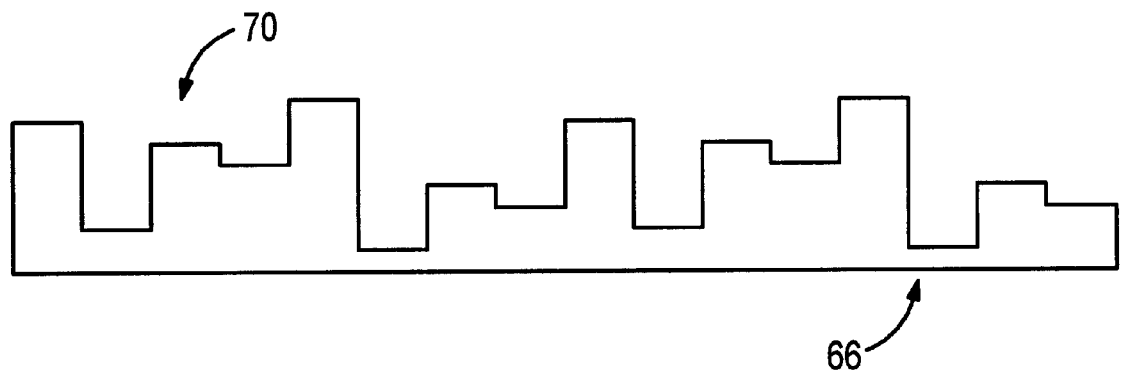
FIG. 8A is a cross-sectional view of a one-dimensional CGH of FIG. 7 having two periods with eight discrete depths per period.
Figure 8B:
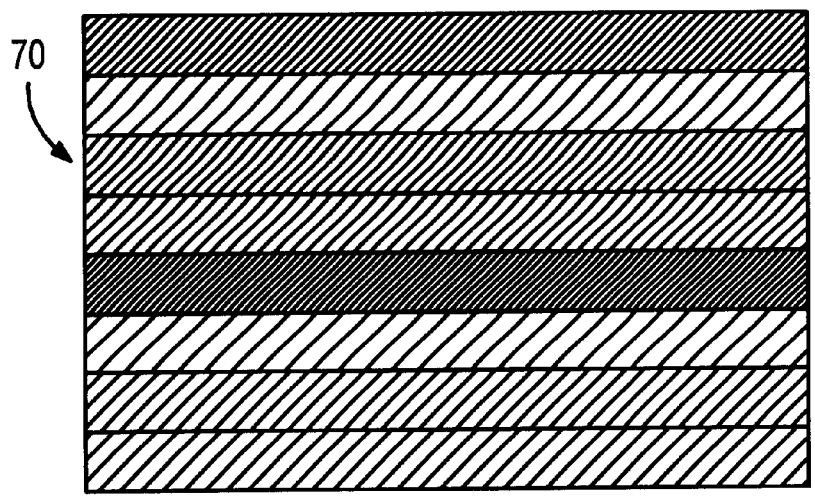
FIG. 8B is a top view of a portion of the one-dimensional CGH of FIG. 8A.

The CGH 64 can be a one-dimensional CGH or a two-dimensional CGH. The one-dimensional CGH is configured to modulate the input beam 32 along one axis. In the preferred embodiment, there are eight discrete surface depths per period etched into the one-dimensional CGH along one axis. Each period may be 30 µm in length, but this is not critical. FIG. 8A shows a cross-sectional view of a one-dimensional CGH having two periods, with each period comprising eight discrete surface depths 70 along one axis. FIG. 8B shows a top view of the one-dimensional CGH 66 of FIG. 8A having one period with eight discrete surface depths 70. In FIG. 8B, each area with a different hatching density represents one discrete surface depth.

Figure 9:
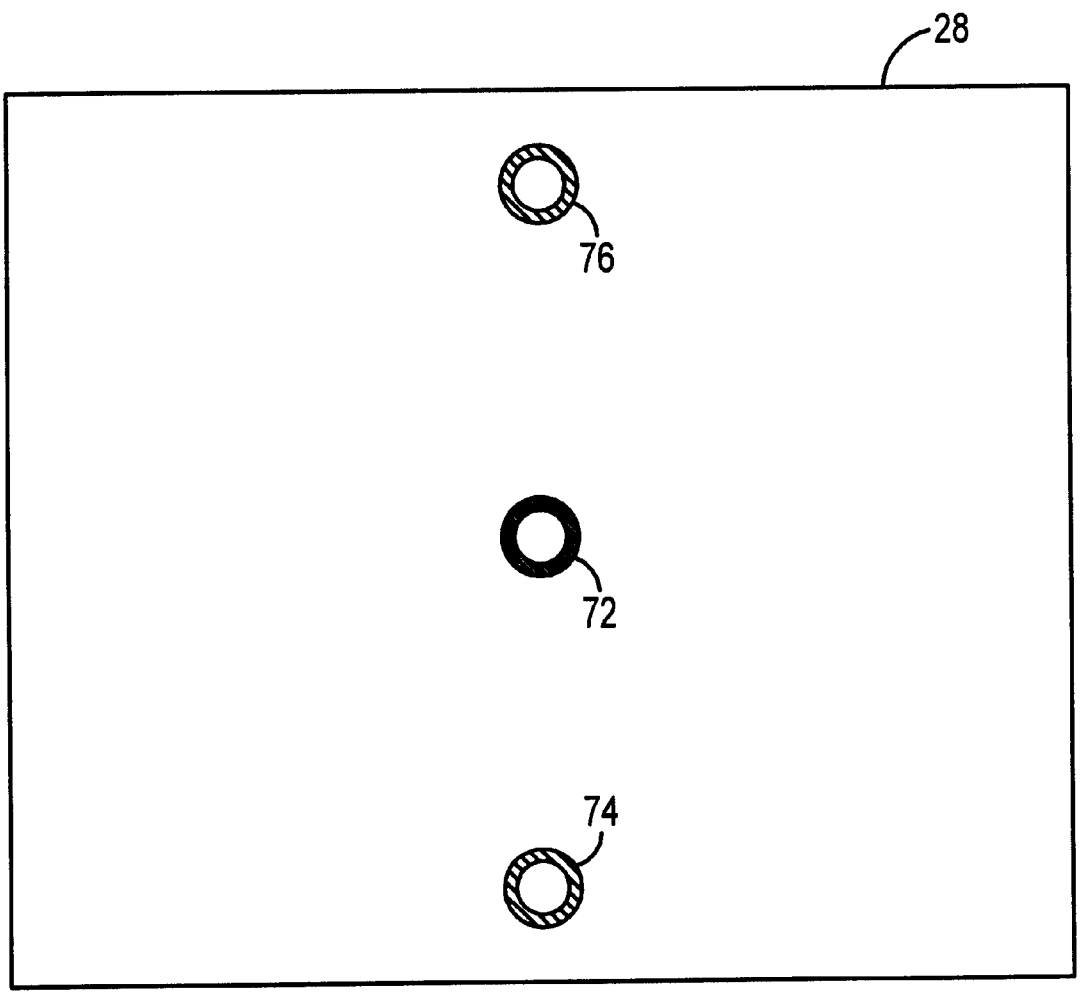
FIG. 9 is a detected optical power output pattern for the one-dimensional CGH of FIG. 7 having a series of ring-shaped patterns.

Referring to FIG. 9, the detected optical power output pattern on the detector 28 as a result of using the one-dimensional CGH 66 (with the collimating beam input region having the spiral configuration 60 of FIG. 6A) is a series of ring-shaped patterns 72, 74 and 76. The ring-shaped pattern 72 with the highest power is located in the middle of the three visible ring-shaped patterns. It is a 0th diffraction order of light propagation from the CGH 66 that is the first portion 34 used for data transmissions. The ring-shaped pattern 74 with the second highest power is located at the bottom of the three visible ring-shaped patterns. It is a 9th diffraction order of light propagation from the CGH 66 that is the second portion 36 used for monitoring.

Other than the 0th diffraction order and the 9th diffraction order, optical power outputs that are detected from the other diffraction orders (i.e., −9th diffraction order to −1st diffraction order and 1st diffraction order to 8th diffraction order) are considered as objectionable noise and cross talk signals, and can lead to eye safety problems if allowed to escape from the parallel channel optical array 44. Some of the noise is represented as the detected ring-shaped pattern 76 with the third highest power that is located at the top of the three visible ring-shaped patterns of FIG. 9. The other objectionable diffraction orders (i.e., −8th diffraction order to −1st diffraction order and 1st diffraction order to 8th diffraction order) are not represented, due to their low optical power outputs.

With reference to FIG. 10, simulation data confirms that the objectionable optical power outputs are at controlled minimal levels relative to the desirable outputs at the 0th and 9th diffraction orders for three target transmissions at 50%, 60% and 75%. For the 50% target transmission, the realized optical power output that is detected at the 0th diffraction order is 52.6%. This figure corresponds to the percentage of the input beam 32 that is the first portion 34 of FIG. 1 used for data transmissions. At the 9th diffraction order, the realized optical power output is 21.3%. This figure corresponds to the percentage of the input beam 32 that is the second portion 36 used for monitoring. Objectionable optical power outputs from the other diffraction orders are at minimal levels relative to the outputs at the 0th and the 9th diffraction order. For example, the maximum objectionable output for a particular diffraction order from the −8th to −1st order and from the 1st to 8th order is 0.5%. Simulation data shows similar results for target transmissions at 60% and 75%. The ratio of the optical power for the different orders are tunable by design. This provides the benefit of satisfying eye safety requirements and using optical sources from various manufacturers.

Figure 11A:
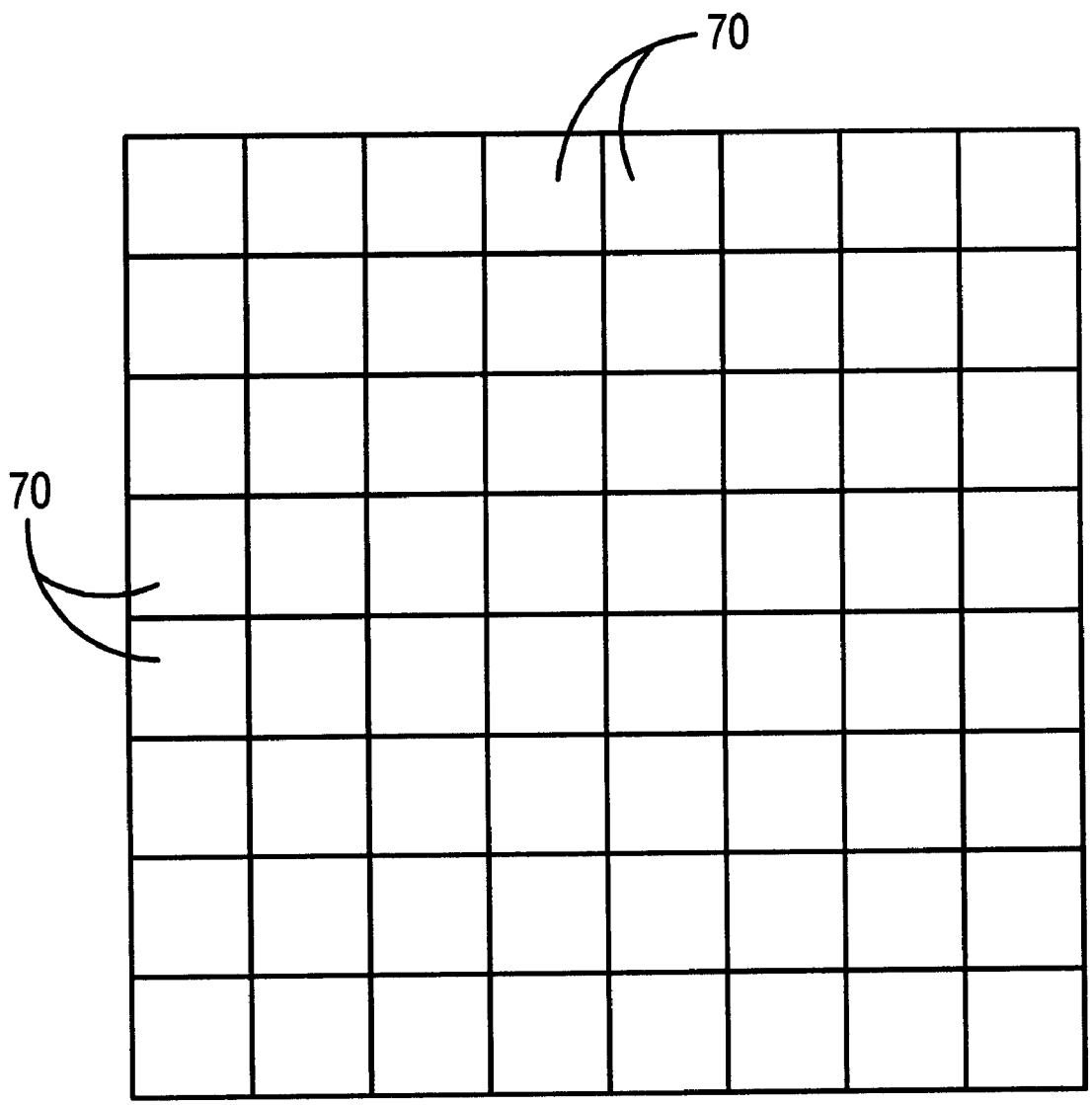
FIG. 11A is a top view of a two-dimensional CGH of FIG. 7 in accordance with a second embodiment.
Figure 11B:
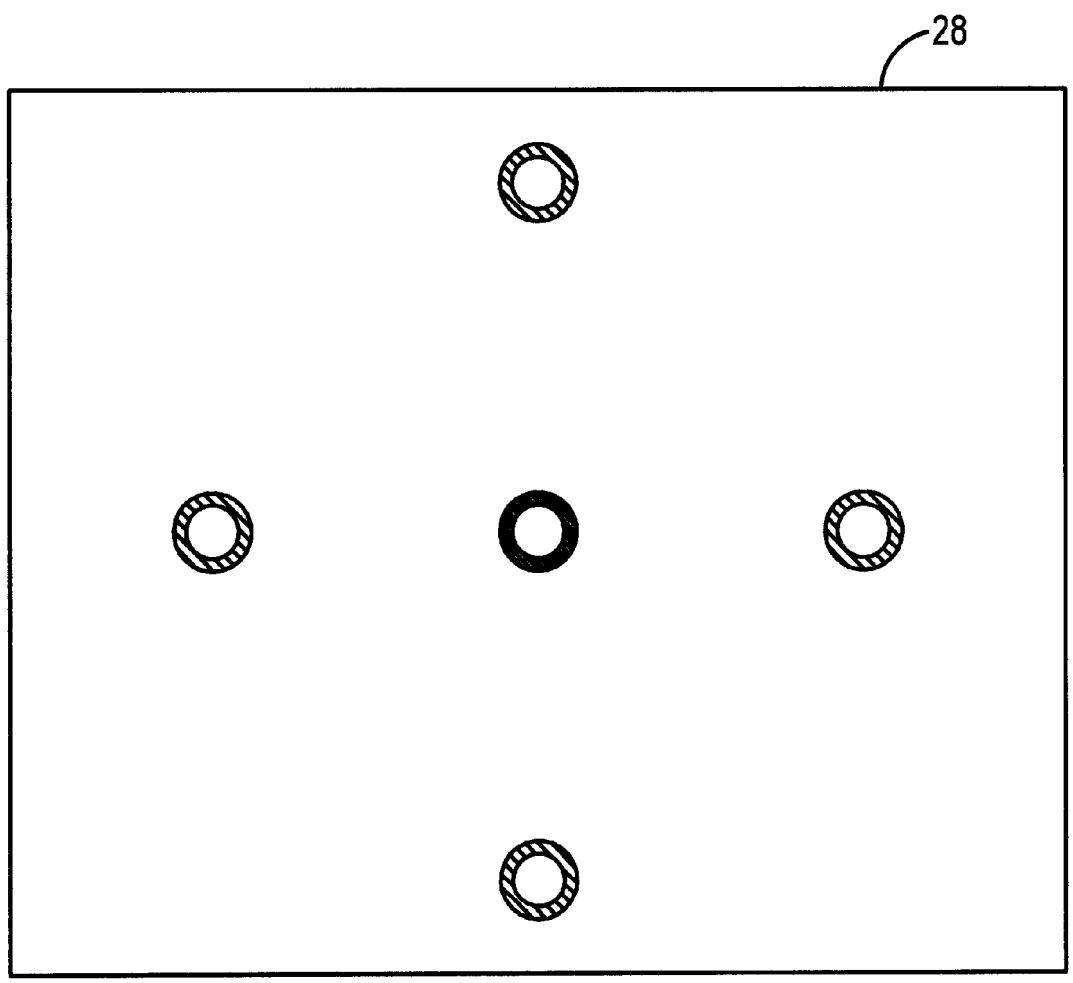
FIG. 11B is a detected optical power output pattern for the two-dimensional CGH of FIG. 7 having two intersecting series of ring-shaped patterns.

For the two-dimensional CGH, the hologram is configured to modulate the input beam 32 along two axes. In the preferred embodiment, there are eight discrete surface depths per period etched into the two-dimensional CGH along the x axis and the y axis. Each period has a length of 30 µm. The period is repeated across the entire surface. FIG. 11A shows a top view of a two-dimensional CGH 68 having eight discrete surface depths 70 along both axes. FIG. 11B shows the optical power output pattern on the detector 28 using the two-dimensional CGH 68. Alternatively, the diffractive feature of the collimating beam input region is that of a volume CGH.

In accordance with an alternative embodiment, FIG. 12 shows the collimating beam input region 14 as having a diffractive feature which may be that of a grating 80. While the preferred embodiment is one in which the diffractive feature of the grating 80 is integrated within the beam input region 14, in order to provide a more clear explanation of the invention, the grating 80 will be described as a separate element. The grating 80 is configured to pass the first portion 34 of the input beam 32 to the beam output region 24 that is aligned and located on the opposite side of the grating 80. Moreover, the grating 80 is configured to diffract the second portion 36 of the input beam 32 for monitoring and feedback.

The grating 80 is a numerically optimized design to diffract the second portion 36 at an angle that is compatible with high volume manufacturing. The grating 80 is a substantially transparent member. It can be formed on glass, plastic, metal, semiconductor, dielectric, polymer, and the like, as long as the refractive index differs from the surrounding medium which, in this case, is air. In the preferred embodiment, the grating 80 is a blazed grating having eight discrete surface depths per period along one axis.

While the preferred embodiment is described as having the diffractive feature formed as one of a one-dimensional CGH 66, a two-dimensional CGH 68, or a grating 80 integrated into the collimating beam input region 14 for the purpose of diffracting the second portion, it should be understood that the diffractive feature can be fabricated and connected as a separate element. In this alternative two-piece arrangement, the collimating beam input region 14 is able to diffract the second portion of the input beam 32 because it is coupled to a separate diffractive element.

Figure 13:
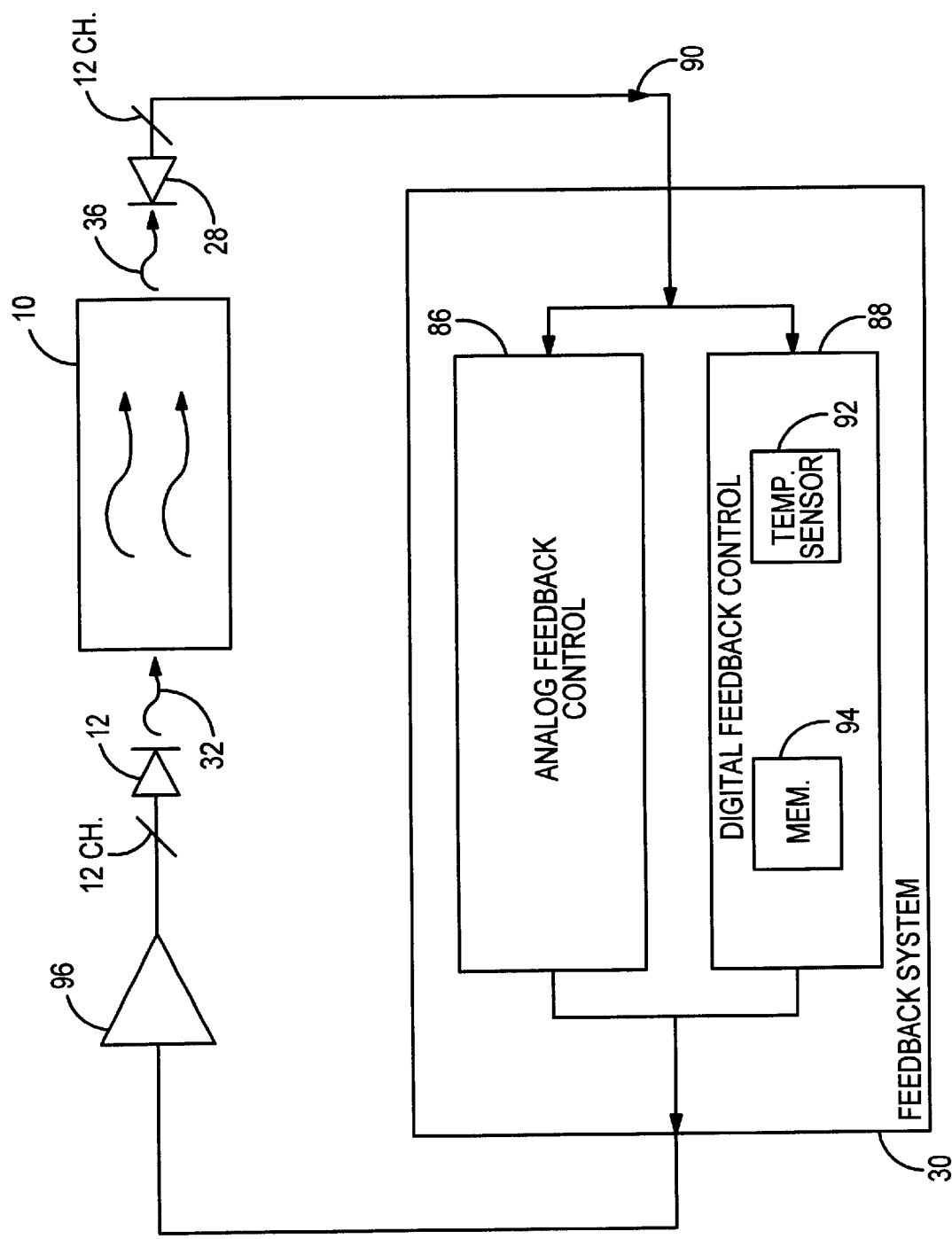
FIG. 13 is a block diagram showing the connections of the detector and feedback system of FIG. 1 for adjusting the input current to each laser diode in the parallel channel optical array.

With reference to FIG. 13, a block diagram is shown as including the detector 28 for monitoring and the feedback system 30 for adjusting the input current to the VCSEL 12. For every channel of the twelve channel (12 CH.) parallel channel optical array 44, the feedback system 30 includes an analog feedback control 86. Additionally, a digital feedback control 88 can be implemented.

The analog feedback control 86 provides one means by which each VCSEL is maintained at a target optical power output power, regardless of changes in variables such as temperature. The optical power output of the second portion 36 is received by the detector 28 and its intensity is used to generate a feedback signal 90. The feedback signal 90 is conducted to the analog feedback control 86. If a drop in optical power output is detected, the analog feedback control 86 will direct a driver 96 to increase the input current to the VCSEL 12. Conversely, if an increase in optical power output is detected, the analog feedback control 86 will direct the driver 96 to lower the input current to the VCSEL 12.

As a second means for compensating for changes in variables such as temperature, the digital feedback control 88 is implemented. Unlike the analog feedback control 86, the digital feedback control uses stored information to determine when and how the input current to the VCSEL should be adjusted in response to the feedback signal 90. The current surrounding temperature is identified by a temperature sensor 92. Corresponding to the identified temperature, a memory device 94, such as an EEPROM, provides characteristic data, including optimum power level data and information not easily measured by the detector 28, such as the slope efficiency of the VCSEL 12. If the detected optical power that is generated from the detector 28 is below the identified optimum power level at the current temperature, the digital feedback control 88 will direct the driver 96 to increase the input current to the VCSEL 12. Conversely, if the detected optical power is above the identified optimum power level at the current temperature, the digital feedback control 88 will direct the driver to decrease the input current to the VCSEL 12.

In accordance with the invention, the VCSEL 12 will modulate between high and low optical power output levels. By the operations of the high speed detector 28 and high speed feedback system 30, the high and low digital levels of the VCSEL 12 can be monitored. Moreover, the detector 28 can determine the average power of the VCSEL 12 for a low frequency design.

Figure 14:
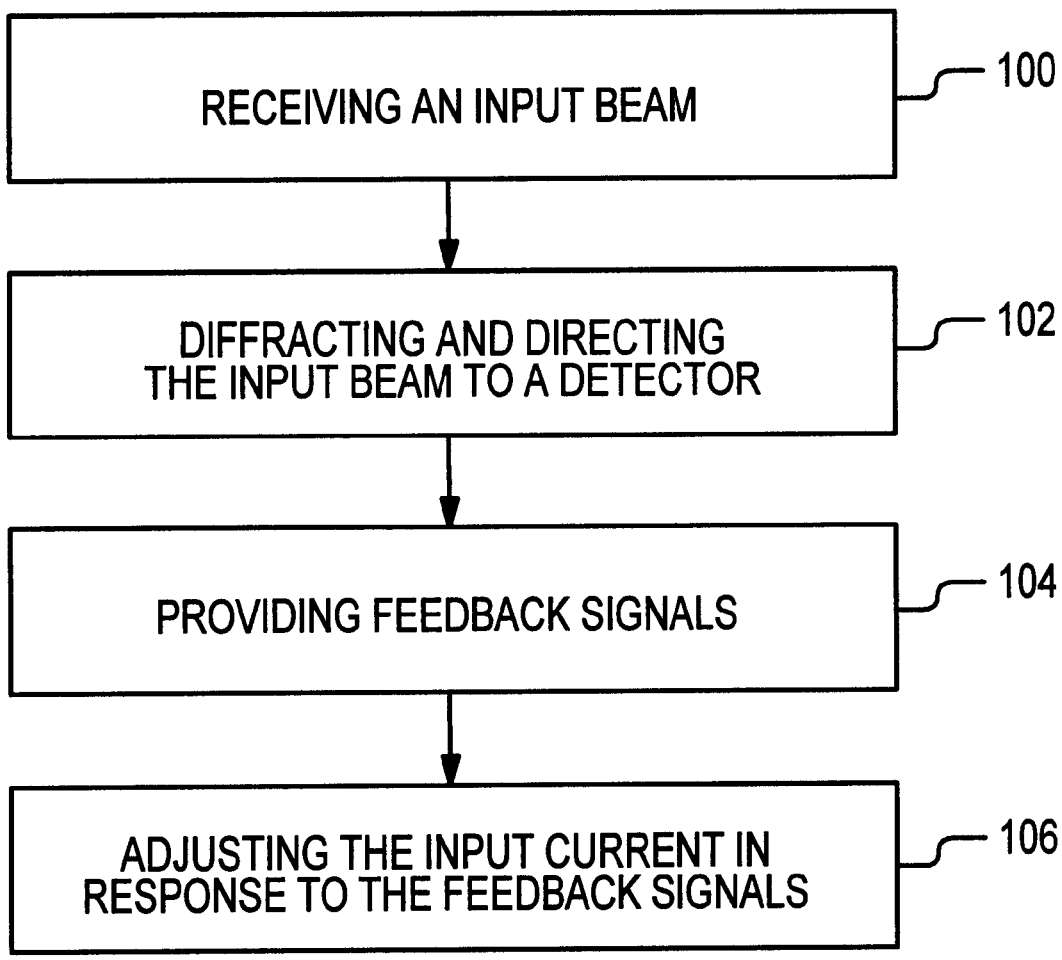
FIG. 14 is a process flow diagram for maintaining an optimum power level for each laser diode in the parallel channel optical array.

Operation of the DOA 10 for maintaining an optimum power level for every channel in the parallel channel optical array 44 is described with reference to the process flow diagram of FIG. 14. In step 100, the input beam 32 from each VCSEL 12 of the parallel channel optical array 44 is received by the DOA 10. In step 102, a portion of the input beam 32 is diffracted and directed through the DOA 10 to the detection output region 22 and onto the detector 28. In step 104, feedback signals are provided. The first feedback signal is the optical power output of the second portion 36 that is received by the detector 28. The second feedback signal is the optimum optical power level at any particular temperature. Finally, in step 106, the input current to the VCSEL 12 is adjusted in response to the first and second feedback signals.

What is claimed is:

1. An optical system comprising:
   a source of an input beam;
   a substantially transparent member having a first side with an input region and a detection output region and having a second side with a beam output region, said input region being aligned with said source and configured to pass a first portion of said input beam through said transparent member to said beam output region while diffracting a second portion of said input beam, said transparent member having at least a first reflective region disposed such that said second portion is reflected to said detection output region;
   a detector aligned with said detection output region to sense optical power of said second portion; and
   a plurality of optical regions positioned relative to said first reflective region such that said plurality of optical regions cooperate to transmit said second portion to said detection region following multiple reflections.

2. The optical system of claim 1 wherein said optical regions include:
   a second reflective region for receiving said second portion from said first reflective region and reflecting said second portion to a third reflective region; and
   said third reflective region for receiving said second portion from said second reflective region and reflecting said second portion to said detection output region, said detection output region being configured to concentrate said second portion to said detector.

3. The optical system of claim 2 wherein said detector is coupled to a feedback system for adjusting an input current for said source of said input beam.

4. An optical monitoring system comprising:
   a substrate;
   a parallel channel optical array fabricated on said substrate, said parallel channel optical array having a plurality of independent channels, each channel including an optical transmitter for emitting an input beam;
   an array of detectors, each said detector being dedicated to one of said input beams;
   an optical arrangement positioned to be impinged by said input beams, said optical arrangement having optical properties to induce diffraction of a portion of each said input beam to said detector dedicated to said input beam, said detectors being operable to generate first feedback signals that are responsive to said diffracted portions of said input beams; and
   a feedback system enabled to individually adjust said input beams in response to said first feedback signals.

5. The optical monitoring system of claim 4 wherein said optical arrangement has a plurality of discrete input surfaces, each said input surface corresponding to a specific one of said channels of said parallel channel optical array and being configured to diffract said portion of said input beam to said dedicated detector.

6. The optical monitoring system of claim 4 wherein said optical arrangement has a single input surface corresponding to all said channels of said parallel channel optical array and being configured to diffract portions of all of said input beams.

7. The optical monitoring system of claim 4 wherein said feedback system further includes:
   a sensor for acquiring exposure data, said exposure data being a second feedback signal;
   a memory device for providing characterization data for said exposure data, said characterization data including target power level information for each said optical transmitter; and
   a modifying mechanism for adjusting said input beam in response to differences between said target power level information and said second feedback signal.

8. The optical monitoring system of claim 4 wherein said exposure data includes temperature data.

9. The optical monitoring system of claim 4 wherein said parallel channel optical array is a 1×12 VCSEL array.

10. The optical monitoring system of claim 4 wherein said detector and said feedback system are integrated on a single substrate member.

11. A method for maintaining a target power level for each laser diode in a parallel channel optical array comprising the steps of:
    receiving an input beam from each said laser diode;
    diffracting said input beam through an optical member to a corresponding detector, said diffracting step including passing said input beam through a diffractive element that is one of a computer generated hologram and a grating;
    providing a first and a second source of feedback signals, said first source being generated in response to monitoring said diffracted input beam and said second source being generated in response to monitoring a variable of said parallel channel optical array; and
    adjusting an input current to said each laser diode in response to said first and second sources of feedback signals.

12. The method of claim 11 wherein said step of diffracting includes providing said optical member to have a continuous surface that is configured to diffract a plurality of said input beams to a plurality of corresponding detectors.

13. The method of claim 11 wherein said step of diffracting includes providing said optical member to include a plurality of diffractive surfaces, each surface being configured to diffract a specific one of said input beams to said corresponding detector.

14. The method of claim 11 wherein said step of monitoring a variable includes detecting an ambient temperature of said parallel channel optical array.

15. The optical system comprising:

a source of an input beam;

a substantially transparent member having a first side with an input region and a detection output region and having a second side with a beam output region, the input region being aligned with the source and configured to pass a first portion of the input beam through the transparent member to the beam output region while diffracting a second portion of the input beam, the transparent member having at least a first reflective region disposed such that the second portion is reflected to said detection output region;

a detector aligned with the detection output region to sense optical power of the second portion; and wherein the input region has integrated diffractive properties.

16. The optical system of claim 15, wherein said input region has integrated diffractive properties of a computer generated hologram (CGH), said input region being configured to pass said first portion and diffract said second portion of said input beam, said first portion corresponding to a first target diffraction order for data transmissions and said second portion corresponding to a second target diffraction order for monitoring.

17. The optical system of claim 16, wherein said first target diffraction order is the 0th diffraction order and said second target diffraction order is a 9th diffraction order.

18. The optical system of claim 16, wherein said CGH is one of one-dimensional CGH and two-dimensional CGH, said one-dimensional CGH having at least eight discrete surface depths per period along one axis and said two-dimensional CGH having at least eight discrete surface depths per period along two axes.

19. The optical system of claim 15, wherein said input region has integrated diffractive properties of a grating, said input region being configured to pass said first portion and diffract said second portion of said input beam.

20. The optical system of claim 15, wherein said input region has integrated diffractive properties of a volume hologram, said input region being configured to pass said first portion and diffract said second portion of said input beam.

21. The optical system of claim 15, wherein said input region is coupled to one of a computer generated hologram (CGH) and a volume hologram and a grating for diffracting said second portion.

* * * * *